US012776753B2

(12) United States Patent
Shirato et al.

(10) Patent No.: US 12,776,753 B2
(45) Date of Patent: Oct. 27, 2026

(54) AMPLIFIER CIRCUIT AND DRIVER CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hiroaki Shirato, Sagamihara Kanagawa (JP); Hiroshi Yoshino, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 464 days.

(21) Appl. No.: 18/481,654

(22) Filed: Oct. 5, 2023

(65) Prior Publication Data

US 2024/0322774 A1 Sep. 26, 2024

(30) Foreign Application Priority Data

Mar. 24, 2023 (JP) ................................ 2023-048975

(51) Int. Cl.
*H03F 3/45* (2006.01)
*H03F 1/26* (2006.01)
*H03F 1/56* (2006.01)

(52) U.S. Cl.
CPC ........... *H03F 3/45475* (2013.01); *H03F 1/26* (2013.01); *H03F 1/56* (2013.01); *H03F 2200/261* (2013.01)

(58) Field of Classification Search
CPC .......... H03F 3/45475; H03F 1/26; H03F 1/56; H03F 2200/261
USPC ............................................................ 330/69
See application file for complete search history.

(56) References Cited

U.S. PATENT DOCUMENTS

| | | | | |
|---|---|---|---|---|
| 4,680,585 A * | 7/1987 | Fasching | H03F 1/303 340/870.19 |
| 5,047,727 A * | 9/1991 | Theus | H03F 1/303 330/261 |
| 6,281,732 B1 * | 8/2001 | Mirow | H03K 3/0232 327/227 |
| 7,714,644 B2 | 5/2010 | Takemoto et al. | |
| 10,848,115 B2 | 11/2020 | Nomura et al. | |
| 11,183,961 B2 | 11/2021 | Yoshinaga et al. | |
| 2007/0222505 A1 * | 9/2007 | Larson | H03F 3/45995 330/9 |

(Continued)

FOREIGN PATENT DOCUMENTS

| | | |
|---|---|---|
| JP | H11-083911 A | 3/1999 |
| JP | 2009-017249 A | 1/2009 |

(Continued)

OTHER PUBLICATIONS

Japanese Office Action for corresponding Japanese Patent Application No. 2023-048975 mailed on Mar. 3, 2026 (10 pages).

*Primary Examiner* — Hafizur Rahman
(74) *Attorney, Agent, or Firm* — Foley & Lardner LLP

(57) ABSTRACT

According to one embodiment, an amplifier circuit is an auto-zero amplifier including a main amplifier, a null amplifier, and a capacitor connected to an output terminal of the null amplifier without interposing a switch for switching an operation mode provided at the output terminal.

6 Claims, 8 Drawing Sheets

(AUTO-ZERO PHASE)

(56) References Cited

U.S. PATENT DOCUMENTS

| | | | | |
|---|---|---|---|---|
| 2009/0009240 | A1 | 1/2009 | Takemoto et al. | |
| 2012/0249243 | A1* | 10/2012 | Rosca | H03F 3/72 330/253 |
| 2016/0195584 | A1* | 7/2016 | Takahashi | G01R 31/3832 324/426 |
| 2019/0097564 | A1 | 3/2019 | Yoshinaga et al. | |
| 2019/0288656 | A1 | 9/2019 | Nomura et al. | |

FOREIGN PATENT DOCUMENTS

| | | | |
|---|---|---|---|
| JP | 2013-236173 | A | 11/2013 |
| JP | 2019-062450 | A | 4/2019 |
| JP | 2019-165298 | A | 9/2019 |
| JP | 2021-145315 | A | 9/2021 |
| JP | 2021-197680 | A | 12/2021 |
| JP | 2024048901 | A * | 4/2024 |

* cited by examiner (AUTO-ZERO PHASE)

AMPLIFIER CIRCUIT AND DRIVER CIRCUIT

CROSS-REFERENCE TO RELATED APPLICATIONS

This application is based upon and claims the benefit of priority from Japanese Patent Application No. 2023-048975, filed on Mar. 24, 2023; the entire contents of which are incorporated herein by reference.

FIELD

Embodiments described herein relate generally to an amplifier circuit and a driver circuit.

BACKGROUND

There is a conventionally known auto-zero amplifier, as a low-offset amplifier circuit, including a main amplifier, a null amplifier (automatic correction amplifier), a first capacitor (capacitance) that holds an offset correction voltage of the null amplifier, and a second capacitor that holds an offset correction voltage of the main amplifier.

The auto-zero amplifier has an operation mode of an auto-zero phase in which the offset correction voltage of the null amplifier is acquired, and an operation mode of an amplifier phase in which an actual operation as an amplifier circuit is performed while correcting the offset voltage of the main amplifier by using the null amplifier operating as an ideal amplifier by correcting the offset correction voltage.

In the auto-zero amplifier, the charges held in the first capacitor and the second capacitor are shifted with time due to leakage current or the like. Thus, in general, the auto-zero phase and the amplifier phase are switched at certain time intervals to refresh and update the charges of the first capacitor and the second capacitor.

However, in the conventional technology, due to the generation of noise based on the switching operation at the time of switching between the auto-zero phase and the amplifier phase or the fact that the null amplifier does not actually operate as an ideal amplifier, there is a possibility that characteristic degradation occurs when the auto-zero amplifier is used for a high-precision circuit using a minute signal or the like.

DETAILED DESCRIPTION

In general, according to one embodiment, an amplifier circuit is an auto-zero amplifier including a main amplifier, a null amplifier, and a capacitor connected to an output terminal of the null amplifier without interposing a switch for switching an operation mode provided at the output terminal.

Figure 1:
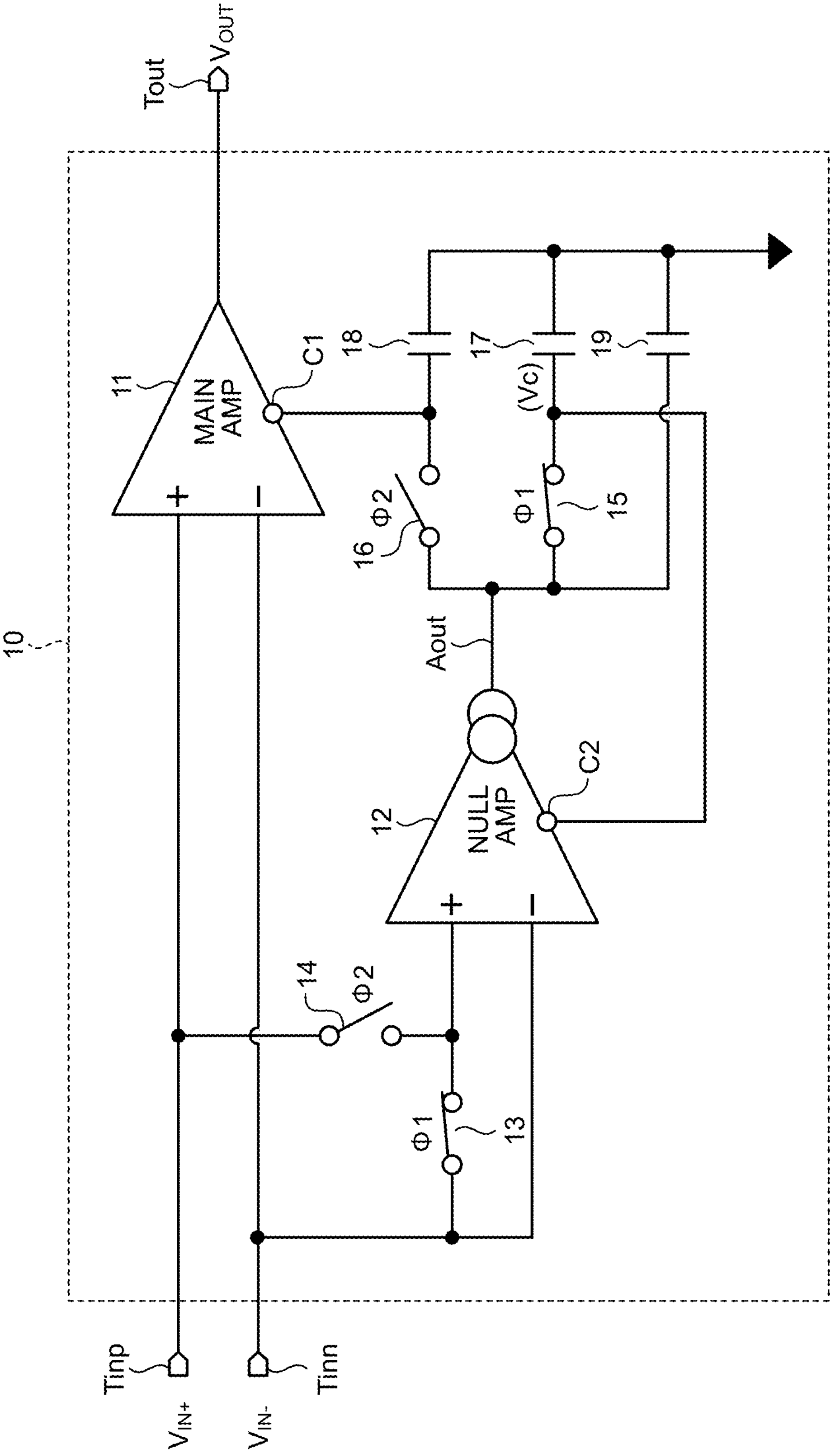
FIG. 1 is an explanatory diagram (auto-zero phase) of a circuit configuration example of an auto-zero amplifier according to an embodiment.

Exemplary embodiments of an amplifier circuit and a driver circuit will be explained below in detail with reference to the accompanying drawings. The present invention is not limited to the following embodiments. FIG. 1 is an explanatory diagram (auto-zero phase) of a circuit configuration example of an auto-zero amplifier 10 according to an embodiment The auto-zero amplifier 10 includes a main amplifier 11, a null amplifier 12, a first switch 13, a second switch 14, a third switch 15, a fourth switch 16, a first capacitor 17, a second capacitor 18, a third capacitor 19, a first input terminal Tinp, a second input terminal Tinn, and an output terminal Tout.

The main amplifier 11 has a non-inverting input terminal connected to the first input terminal Tinp, an inverting input terminal connected to the second input terminal Tinn, and an output terminal connected to the output terminal Tout.

The null amplifier 12 has a non-inverting input terminal connectable to the second input terminal Tinn via the first switch 13 and connectable to the first input terminal Tinp via the second switch 14, an inverting input terminal connected to the second input terminal Tinn, an output terminal connected to one end of the third switch 15, one end of the fourth switch 16, and one end of the third capacitor 19, and an offset correction voltage input terminal C2 connected to the other end of the third switch 15.

The first switch 13 has one end connected to the second input terminal Tinn and the other end connected to the non-inverting input terminal of the null amplifier 12. The second switch 14 has one end connected to the first input terminal Tinp and the other end connected to the non-inverting input terminal of the null amplifier 12.

The third switch 15 has one end connected to the output terminal of the null amplifier 12 and the other end connected to one end of the first capacitor 17. The fourth switch 16 has one end connected to the output terminal of the null amplifier 12 and the other end connected to one end of the second capacitor 18 and the offset correction voltage input terminal C1 of the main amplifier 11.

The first capacitor 17 has one end connected to the offset correction voltage input terminal (loop terminal) C2 of the null amplifier 12 and the other end being grounded. The second capacitor 18 has one end connected to the offset correction voltage input terminal (loop terminal) C1 of the main amplifier 11 and the other end being grounded. The third capacitor 19 has one end connected to the output terminal of the null amplifier 12 and the other end being grounded.

Figure 5:
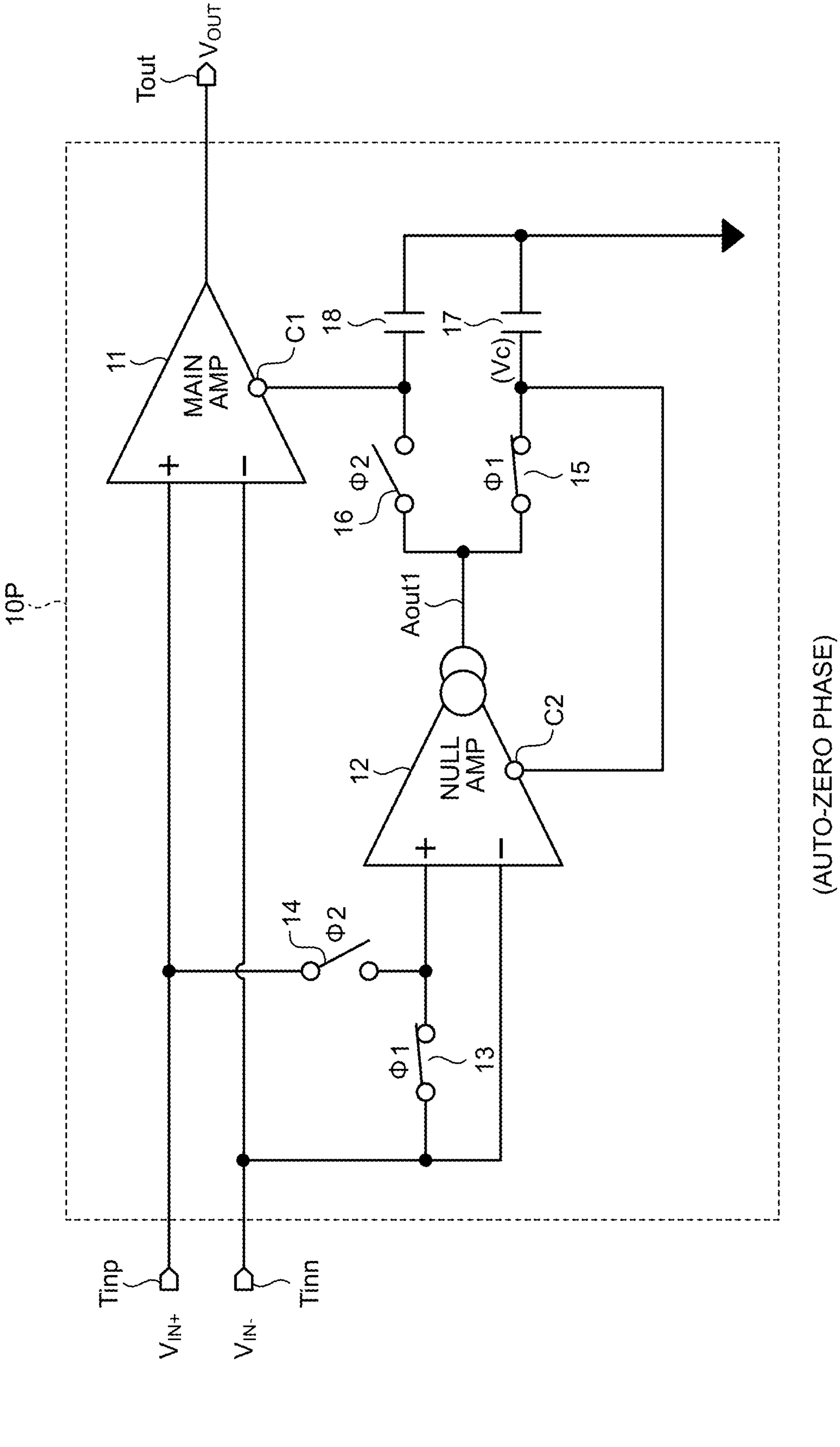
FIG. 5 is an explanatory diagram (auto-zero phase) of a circuit configuration example of an auto-zero amplifier according to a comparative example.
Figure 6:
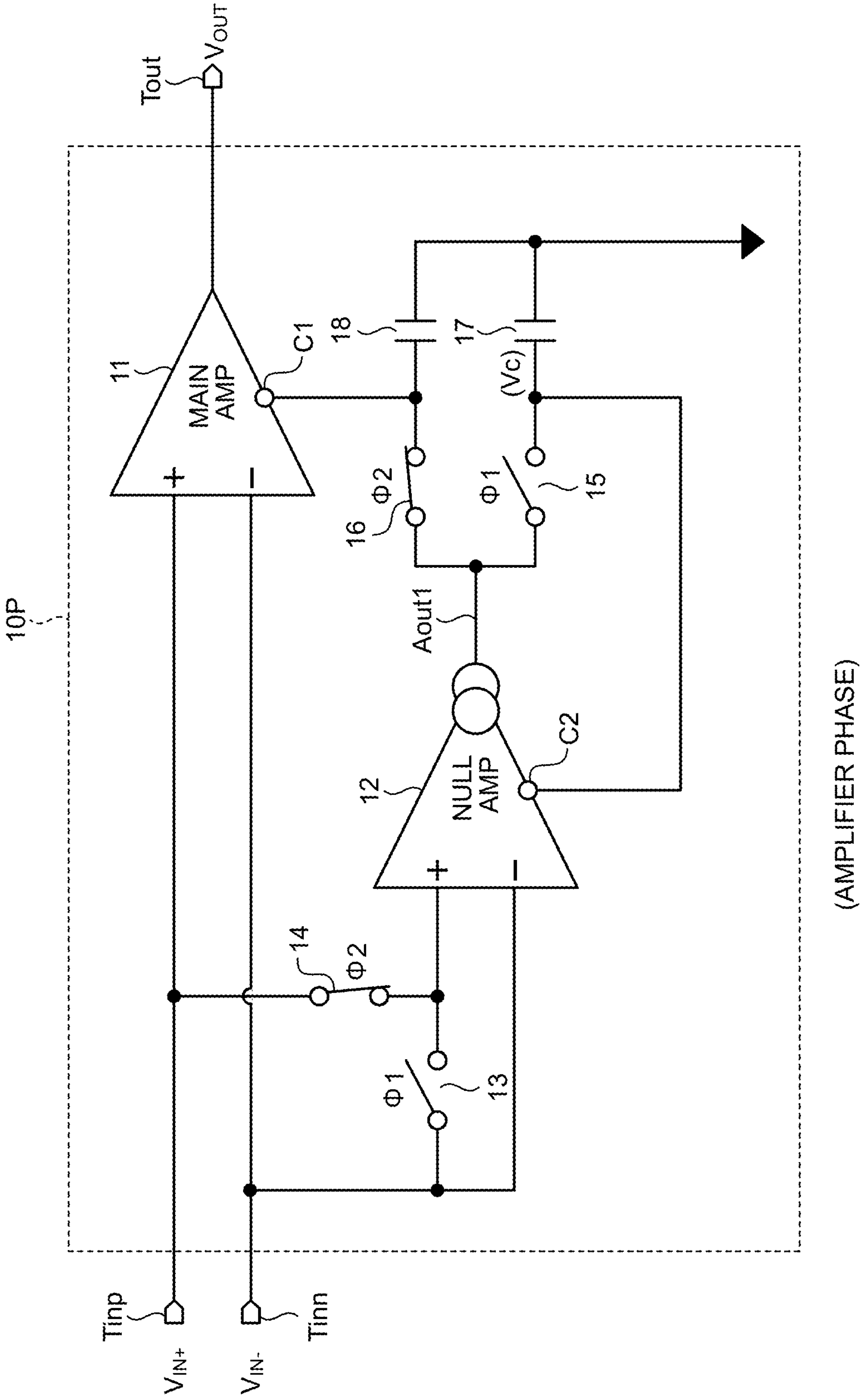
FIG. 6 is an explanatory diagram (amplifier phase) of a circuit configuration example of the auto-zero amplifier of the comparative example.

Here, prior to the description of a first embodiment, a comparative example will be described. FIG. 5 is an explanatory diagram (auto-zero phase) of a circuit configuration example of an auto-zero amplifier according to a comparative example. FIG. 6 is an explanatory diagram (amplifier phase) of a circuit configuration example of the auto-zero amplifier of the comparative example. In FIGS. 5 and 6, the same parts as those in the embodiment of FIG. 1 are denoted by the same reference numerals.

An auto-zero amplifier 10P of the comparative example of FIGS. 5 and 6 is different from the auto-zero amplifier 10 of FIG. 1 in that the third capacitor 19 connected in parallel to the third switch 15 and the first capacitor 17 is not provided.

Next, an operation of the auto-zero amplifier 10P of the comparative example will be described. The operation modes of the auto-zero amplifier 10P include an auto-zero phase mode in which each unit is connected as illustrated in FIG. 5 and an amplifier phase mode in which each unit is connected as illustrated in FIG. 6.

In the auto-zero phase mode, as illustrated in FIG. 5, the non-inverting input terminal and the inverting input terminal (=differential input terminal) of the null amplifier 12 are short-circuited with the first switch 13 in an ON state (closed state), and the output terminal of the null amplifier 12 is connected to the offset correction voltage input terminal C2 with the third switch 15 in an ON state. The second switch 14 and the fourth switch 16 are in an OFF state (open state).

As a result, the null amplifier 12 is in a buffer state, and the non-inverting input terminal and the inverting input terminal of the null amplifier 12 are short-circuited, and thus, the offset correction voltage of the null amplifier 12 itself is held in the first capacitor 17.

In this case, since the null amplifier 12 is excluded from the operation loop to the main amplifier 11, the main amplifier 11 performs offset correction using the charge (voltage) held in the second capacitor 18 and operates.

On the other hand, in the amplifier phase mode, as illustrated in FIG. 6, the second switch 14 of the input of the null amplifier 12 is in the ON state and connected in parallel in the same manner as the main amplifier 11, and the output terminal of the null amplifier 12 is connected to the second capacitor 18 when the fourth switch 16 is in the ON state.

This causes the null amplifier 12 to operate using the voltage held in the first capacitor 17. Thus, the null amplifier 12 in the state corrected by the offset correction voltage confirmed in the auto-zero phase mode theoretically operates as an ideal amplifier not affected by the offset, and it operates while correcting the offset voltage of the main amplifier 11.

In the auto-zero amplifier 10P in practice, a leakage current or the like is present in the first capacitor 17 and the second capacitor 18, and the charges held by the first capacitor 17 and the second capacitor 18 holding the offset correction voltage fluctuate with time due to the leakage current or the like, and eventually, the offset correction voltage fluctuates with time.

Thus, in a typical auto-zero amplifier, the offset voltage correction is more reliably performed by switching between the auto-zero phase mode and the amplifier phase mode at certain time intervals to refresh and update the capacitive charges of the two capacitors.

Figure 7:
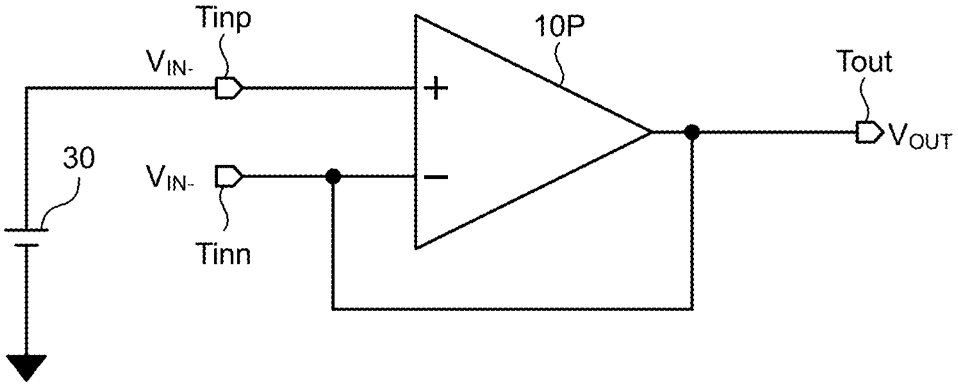
FIG. 7 is an explanatory diagram illustrating an example of a case where a buffer amplifier is configured using the auto-zero amplifier of the comparative example.

FIG. 7 is an explanatory diagram in a case where a buffer amplifier is configured using the auto-zero amplifier of the comparative example. As illustrated in FIG. 7, a buffer amplifier is configured using the auto-zero amplifier 10P illustrated in FIG. 5.

In this case, the output terminal Tout of the auto-zero amplifier 10P is connected to the second input terminal Tinn to form a feedback loop, with which the auto-zero amplifier 10P serves as a buffer amplifier. Here, it is assumed that a freely-selected power supply 30 having a predetermined voltage is connected to the first input terminal Tinp and the operation is checked.

Figure 8:
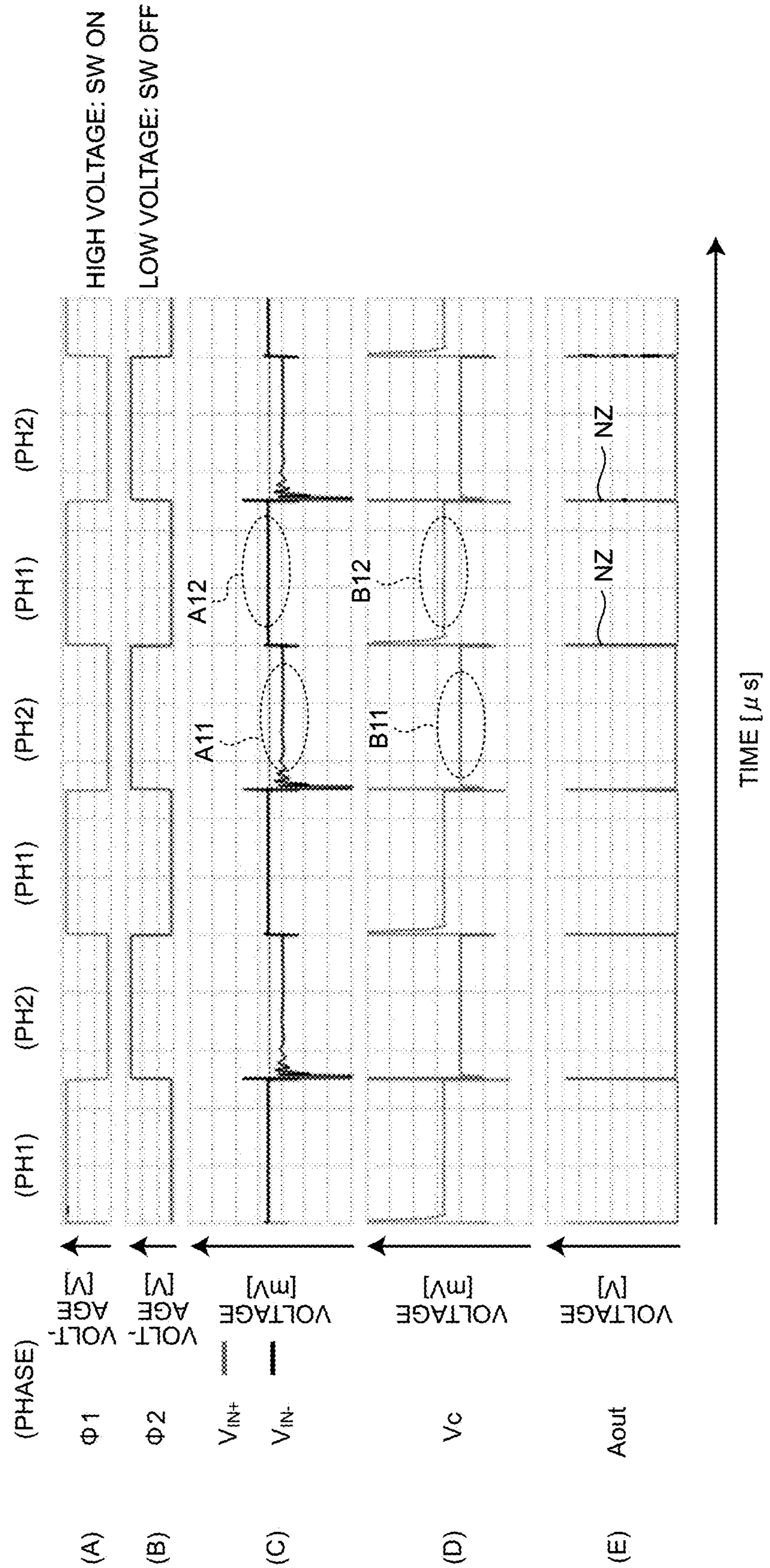
FIG. 8 is an explanatory diagram illustrating an example of an operation waveform of the buffer amplifier of FIG. 7.

FIG. 8 is an explanatory diagram of an operation waveform of the buffer amplifier of FIG. 7. Since the auto-zero amplifier 10P holds the voltage for offset correction of the null amplifier 12 in the first capacitor 17 and holds the voltage for offset correction of the main amplifier 11 in the second capacitor 18, it is necessary to avoid interference between the held voltages. Thus, in order to prevent the third switch 15 and the fourth switch 16 from entering the ON state at the same time, a period during which both the first switch 13 and the second switch 14 are in the OFF state is required.

When the switch to be in the ON state is switched from one of the third switch 15 and the fourth switch 16 to the other switch, it is not possible to acquire a correct offset correction voltage with both the third switch 15 and the fourth switch 16 being in the ON state. Thus, there is a possibility that the offset correction cannot be performed correctly, the reliability of the offset correction voltage is lowered, and the characteristics of the buffer amplifier degrade.

For this reason, it is necessary to reliably provide a period during which both the third switch 15 and the fourth switch 16 are in a high-impedance state (OFF state), but there has been a possibility that the following problem is caused by lengthening the period during which both the third switch 15 and the fourth switch 16 are in the high-impedance state (OFF state).

Shifting to the period during which both the third switch 15 and the fourth switch 16 are off means that the connection of the load suddenly disappears for the null amplifier 12 (high-impedance state), and thus, the voltage itself of the output signal Aout of the null amplifier 12 also suddenly changes and greatly fluctuates.

More specifically, as illustrated in (E) of FIG. 8, the fourth switch 16 enters the ON state in a state where a noise NZ is generated because of fluctuation of the voltage of the output signal Aout of the null amplifier 12, and thus, as illustrated in (C) of FIG. 8, the output voltage of the main amplifier 11 also easily fluctuates immediately after shifting to an amplifier phase mode PH2.

In addition, as described above, when an auto-zero phase PH1 is switched to the amplifier phase PH2, the influence of the voltage fluctuation of the output signal Aout of the null amplifier 12 immediately before the third switch 15 completely shifts to the OFF state occurs. More specifically, for example, as indicated by broken line ellipses B11 and B12 in (D) of FIG. 8, a deviation occurs in an offset correction voltage Vc held in the first capacitor 17 between the auto-zero phase PH1 and the amplifier phase PH2.

When the auto-zero phase PH1 is switched to the amplifier phase PH2, the waveform fluctuation occurs in the same manner in an input signal $V_{IN-}$, and for example, as illustrated by broken line ellipses A11 and A12 in (C) of FIG. 8, a deviation occurs in the voltage level even when the input signals $V_{IN-}$ are the same.

In this manner, the auto-zero amplifier 10P of the comparative example has problems, for example, noise of voltage fluctuation in $V_{IN-}$ is generated at the time of switching from the auto-zero phase to the amplifier phase as described above, and a difference in $V_{IN-}$ voltage is generated between the auto-zero phase and the amplifier phase which causes the offset voltage correction to deteriorate and not to ideally operate, and characteristic degradation occurs when the auto-zero amplifier is used in a high-precision circuit using a minute signal or the like.

Next, the operation of the auto-zero amplifier 10 according to the embodiment will be described. As described above, the auto-zero amplifier 10 of FIG. 1 is different from the auto-zero amplifier 10P of FIG. 5 in that the output terminal of the null amplifier 12 is provided with the third capacitor 19 that is always connected without interposing a switch.

The operation will be described below. In the auto-zero phase mode, the differential input of the null amplifier 12 is short-circuited by the first switch 13, and the output terminal of the null amplifier 12 causes the third switch 15 to enter the ON state, whereby the null amplifier 12 enters the buffer state.

Then, the offset correction voltage of the null amplifier 12 itself is held in the first capacitor 17 and the third capacitor 19, and the offset correction voltage of the null amplifier 12 itself is acquired and then corrected.

In this case, in the connection state as illustrated in FIG. 1, the null amplifier 12 is excluded from the operation loop to the main amplifier 11. Thus, the main amplifier 11 operates using the voltage held in the second capacitor 18 as the offset correction voltage of the main amplifier 11.

Figure 2:
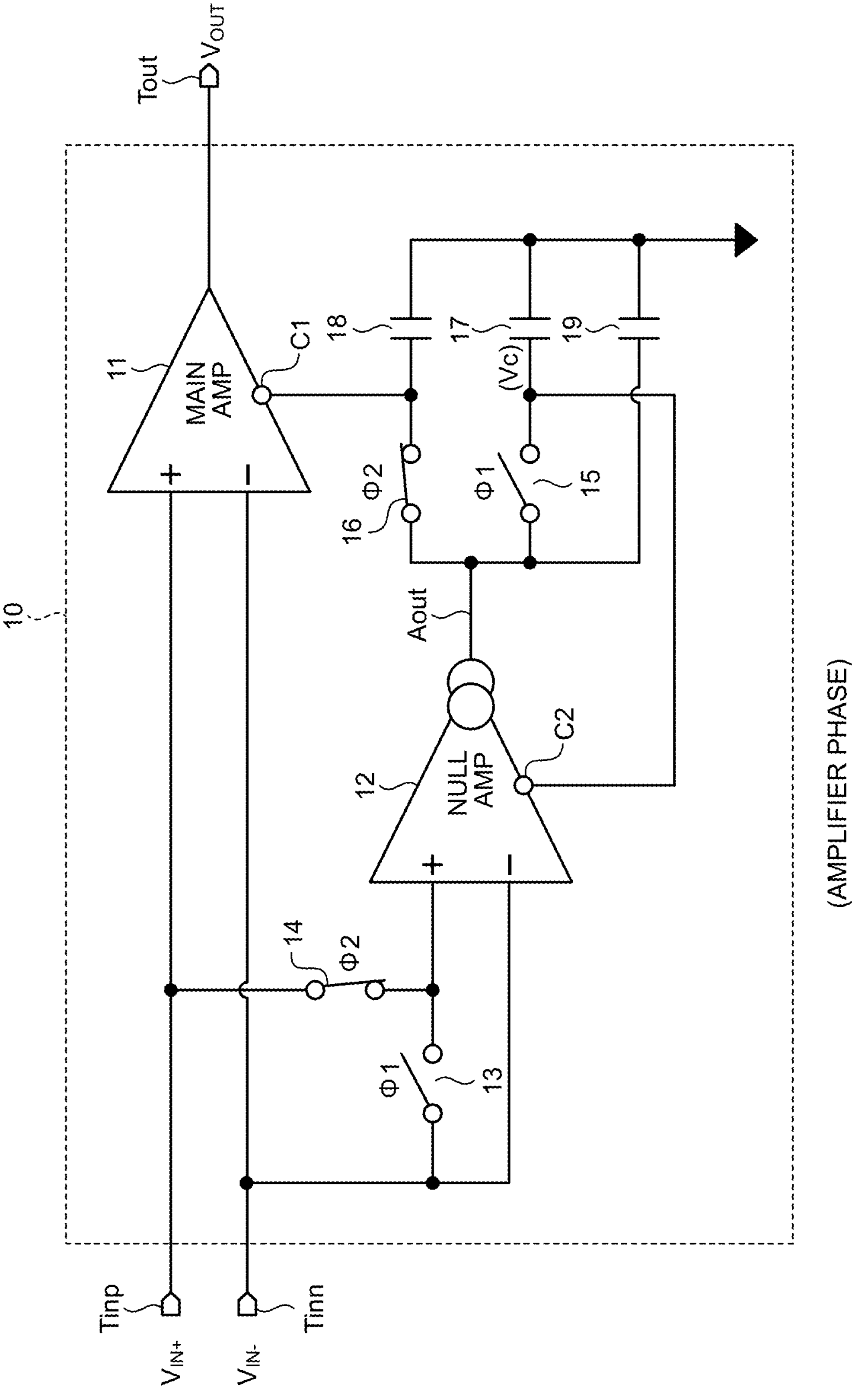
FIG. 2 is an explanatory diagram (amplifier phase) of a circuit configuration example of the auto-zero amplifier according to the embodiment.

FIG. 2 is an explanatory diagram (amplifier phase) of a circuit configuration example of the auto-zero amplifier according to the embodiment. In the amplifier phase mode, as illustrated in FIG. 2, the second switch 14 is in the ON state, the null amplifier 12 is connected in parallel in the same manner as the main amplifier, and the output terminal of the null amplifier 12 is connected to the third capacitor 19 and is connected to the second capacitor 18 via the fourth switch 16.

This causes the null amplifier 12 to operate using the offset correction voltage held in the first capacitor 17.

The null amplifier 12 whose offset voltage has been corrected in the auto-zero phase described above can operate as an ideal amplifier, and it operates while correcting the offset voltage of the main amplifier 11.

As described in the description of the problems of the comparative example, in the auto-zero amplifier 10 of the embodiment as well, the charges held in the first capacitor 17, the second capacitor 18, and the third capacitor 19 fluctuate with time because of leakage current or the like.

Thus, also in the present embodiment, the auto-zero phase mode and the amplifier phase mode are switched at certain time intervals, and the charges of the first capacitor 17, the second capacitor 18, and the third capacitor 19 are refreshed and updated in the same manner as in the comparative example.

In this manner, in the case of the circuit configuration of the embodiment, the third capacitor 19 is always connected to the output terminal of the null amplifier 12, and unlike the comparative example, the load of the null amplifier 12 does not suddenly disappear even when the third switch 15 and the fourth switch 16 are switched, which can stably operate the null amplifier 12.

Thus, a problem of generation of noise of voltage fluctuation in $V_{IN-}$ at the time of switching from the auto-zero phase to the amplifier phase is not caused, and the offset voltage correction does not deteriorate due to a difference in the $V_{IN-}$ voltage between the auto-zero phase and the amplifier phase. Therefore, it can be seen that this configuration realizes an ideal operation and can prevent characteristic degradation even when the auto-zero amplifier is used in a high-precision circuit that handles a minute signal or the like.

Figure 3:
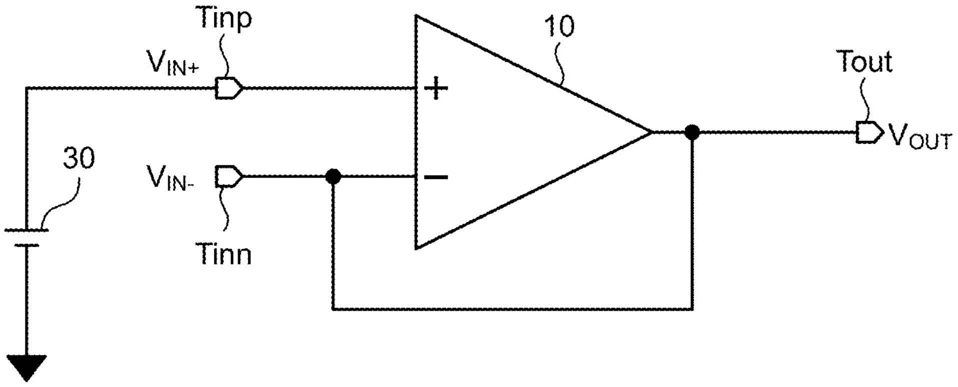
FIG. 3 is an explanatory diagram illustrating an example of a case where a buffer amplifier is configured using the auto-zero amplifier according to the embodiment.

Next, the operation of the embodiment will be described more specifically. FIG. 3 is an explanatory diagram in a case where a buffer amplifier is configured using the auto-zero amplifier of the embodiment. As illustrated in FIG. 3, a buffer amplifier is configured using the auto-zero amplifier 10 illustrated in FIG. 1. In this case, the output terminal Tout of the auto-zero amplifier 10 is connected to the second input terminal Tinn to form a feedback loop, with which the auto-zero amplifier 10 serves as a buffer amplifier. Here, it is assumed that a freely-selected power supply 30 having a predetermined voltage is connected to the first input terminal Tinp and the operation is checked.

Figure 4:
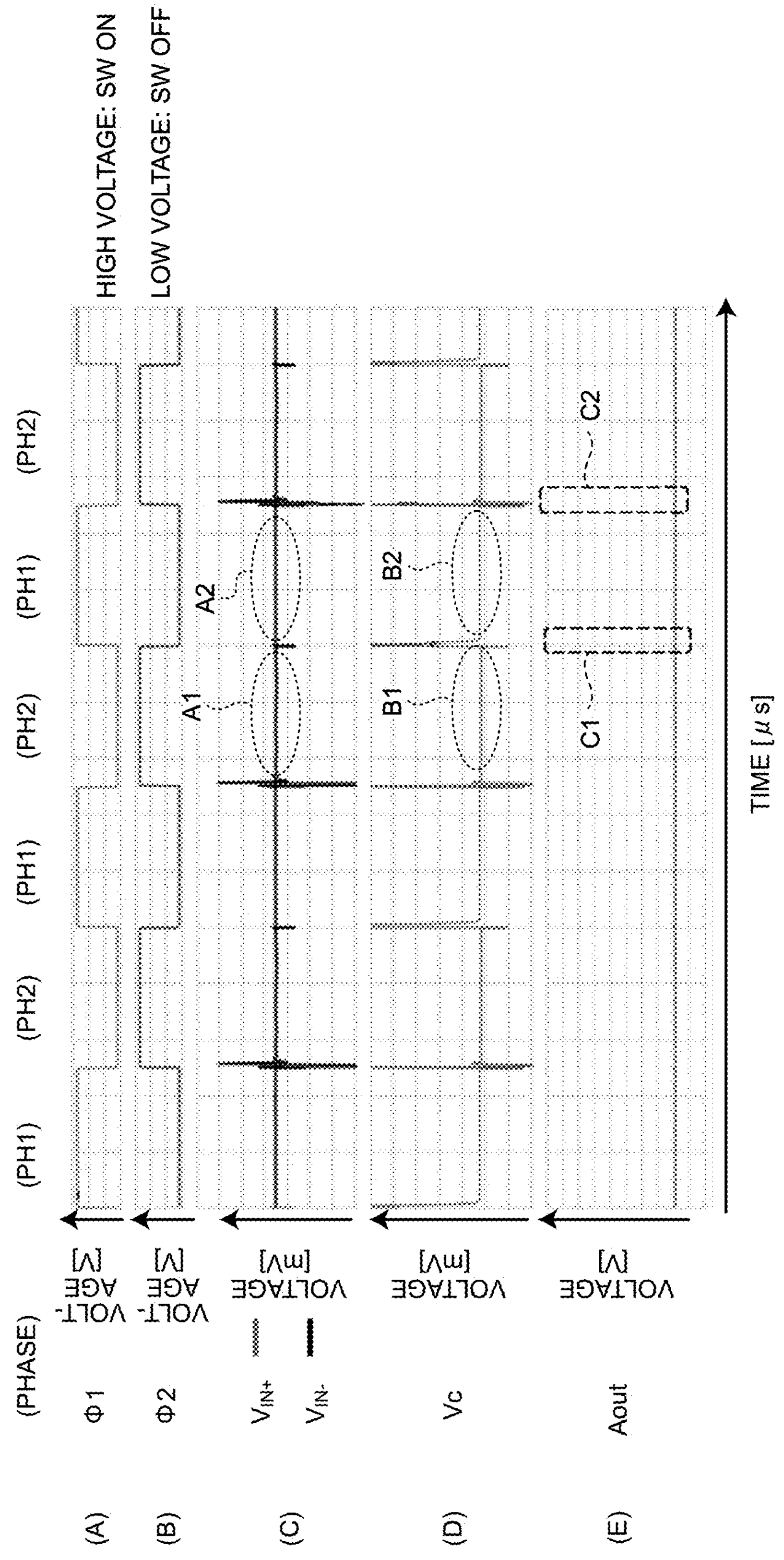
FIG. 4 is an explanatory diagram illustrating an example of an operation waveform of the buffer amplifier of FIG. 3.

FIG. 4 is an explanatory diagram of an operation waveform of the buffer amplifier of FIG. 3. In the comparative example, there is a problem that noise of the voltage fluctuation is generated in the input signal $V_{IN-}$ at the time of switching from the auto-zero phase to the amplifier phase. However, in the buffer amplifier of the embodiment, as illustrated in (C) of FIG. 4, the period of the voltage fluctuation of the input signal $V_{IN-}$ at the second input terminal Tinn is shortened, and it can be seen that an improvement is made.

In the comparative example, as illustrated in (C) of FIG. 8, there is a problem that in the input signal $V_{IN-}$ at the second input terminal Tinn, the offset voltage correction deteriorates due to a difference in voltage between the auto-zero phase and the amplifier phase, and an ideal operation is not achieved. However, in the present proposal, it can be seen that the voltage difference between the auto-zero phase and the amplifier phase is reduced in $V_{IN-}$, and the problem of characteristic degradation is improved.

In the present embodiment, even when the third switch 15 and the fourth switch 16 connected to the output terminal of the null amplifier 12 are switched at the time of switching the phases, the third capacitor 19 is always connected to the output terminal of the null amplifier 12, and thus, the voltage state in each phase mode can be held no matter whether the phase is the auto-zero phase mode or the amplifier phase mode.

That is, since the third capacitor 19 is always connected to the output terminal of the null amplifier 12 even when both the third switch 15 and the fourth switch 16 are in the OFF state, the output terminal of the null amplifier 12 does not enter the high-impedance state, and it is possible to prevent a rapid change in the load of the output terminal of the null amplifier 12.

More specifically, as illustrated in (E) of FIG. 4, the fourth switch 16 enters the ON state with no fluctuation in the voltage of the output signal Aout of the null amplifier 12, for example, with no noise generation at the positions of the broken line frames C1 and C2 unlike the comparative example. Thus, as illustrated in (C) of FIG. 4, fluctuation in the output voltage of the main amplifier 11 can be reduced even immediately after shifting to the amplifier phase mode PH2.

When the auto-zero phase PH1 is switched to the amplifier phase PH2, it is possible to reduce the voltage fluctuation of the output signal Aout of the null amplifier 12 immediately before the third switch 15 completely shifts to the OFF state. Thus, as indicated by broken line ellipses B1 and B2 in (D) of FIG. 4 for example, it is also possible to prevent the offset correction voltage Vc held in the first capacitor 17 from deviating between the auto-zero phase PH1 and the amplifier phase PH2.

In the same manner, as illustrated in (C) of FIG. 4, also when the auto-zero phase PH1 is switched to the amplifier phase PH2, it is possible to prevent the fluctuation of the waveform generated in the input signal $V_{IN-}$, and, for example, as illustrated by broken line ellipses A1 and A2 in (C) of FIG. 4, it is possible to prevent the deviation of the voltage level when the input signals $V_{IN-}$ are the same.

In this manner, the auto-zero amplifier 10 according to the embodiment eliminates a problem of generation of noise of voltage fluctuation in the input signal $V_{IN-}$ at the time of switching from the auto-zero phase to the amplifier phase and a problem of generation of a difference in the voltage of the input signal $V_{IN-}$ between the auto-zero phase and the amplifier phase and deterioration of the offset voltage correction with which an ideal operation is not performed as in the comparative example.

Thus, the auto-zero amplifier can perform highly reliable processing without causing characteristic degradation when it is used in a high-precision circuit that handles a minute signal or the like. The noise generated in the input signal $V_{IN-}$ in a short period at the time of phase switching as illustrated in (C) of FIG. 4 can be removed by a blanking filter or the like since the generation timing is known in advance, and the noise does not become a particular problem.

In the configuration of the auto-zero amplifier illustrated in FIGS. 1 and 2 of the embodiment, the first capacitor 17, the second capacitor 18, and the third capacitor 19 are grounded to a low-potential side power supply that is a reference potential, but they may be connected to any voltage stable in direct current.

In the above description, the auto-zero amplifier configuration example of FIGS. 1 and 2 has been described. However, the same effect can be expected with a different connection between the + terminal and the − terminal of the main amplifier and the null amplifier constituting the auto-zero amplifier, even with a different connection state of the switch or with a different setting state of the switch, by providing a capacitor that is always (or continuously) connected to the output of the null amplifier without interposing a switch or the like in the auto-zero amplifier.

FIGS. 1 and 2 illustrate a configuration example of the auto-zero amplifier in which one null amplifier 12 is mounted. However, the same effect can be expected with a configuration of an auto-zero amplifier in which a plurality of null amplifiers are mounted, by providing capacitors continuously connected to the output terminals of the mounted null amplifiers over time without interposing a switch or the like.

First Modification of Embodiment

In the above description, the state in which both the third switch 15 and the fourth switch 16 are enter the OFF state when the auto-zero phase and the amplifier phase are switched has not been described in detail, but the third capacitor 19 is always connected to the output terminal of the null amplifier 12.

Thus, even when the period during which both the third switch 15 and the fourth switch 16 are in the OFF state is extended, the output voltage itself of the output terminal of the null amplifier 12 does not rapidly change. Thus, the period during which both the third switch 15 and the fourth switch 16 are in the OFF state can be easily set long, and highly reliable switching can be performed.

Second Modification of Embodiment

A unity gain frequency F, which is the frequency at which the gain of the null amplifier 12 in the auto-zero phase according to the embodiment is 1 (hereinafter, referred to as a unity gain frequency), is represented by the following equality, where gm is a transconductance of the null amplifier 12, $C_3$ is a capacitance of the third capacitor 19 continuously connected over time to the output of the null amplifier 12 without interposing a switch or the like, and $C_1$ is a capacitance of the first capacitor 17.

$$F = gm/\{2\pi(C_3 + C_1)\}$$

The unity gain frequency F of the null amplifier is desirably higher than the switching frequency fm between the mode of the auto-zero phase and the mode of the amplifier phase. This is because it is necessary to correctly hold the voltage to be used for the offset correction in the auto-zero phase in the first capacitor 17 and the third capacitor 19.

In the above case, the relational expression between the switching frequency fm and the unity gain frequency is as follows.

$$fm < gm/\{2\pi(C_3 + C_1)\}$$

It is preferable to set the first capacitor 17 mainly in consideration of setting a capacitance value such that the charge held in the period of the amplifier phase is not shifted by a leakage current or the like to affect the offset correction.

In addition, setting the capacitance $C_3$ of the third capacitor 19 to a value that holds the following expression can improve offset voltage correction.

$$fm < gm/\{2\pi(C_3 + C_1)\}$$

Third Modification of Embodiment

The frequency characteristic of the amplifier phase mode of the auto-zero amplifier 10 of the embodiment needs to secure a predetermined phase margin so as not to oscillate, and by setting the value of the capacitance value $C_3$ of the third capacitor 19 continuously connected over time to the output of the null amplifier 12 without interposing a switch or the like in such a manner as to be able to secure the phase margin, it is possible to preferably control voltage fluctuation and the like at the time of switching from the auto-zero phase to the amplifier phase.

Other Embodiment

In the above description, the auto-zero amplifier as the amplifier circuit has been described. However, a driver circuit can be configured using the amplifier circuit as a circuit that detects a control amount.

For example, it is possible to configure a motor driver circuit that performs feedback control of a motor acting as an external load and drives the motor by connecting the motor to the output terminal Tout of the auto-zero amplifier as an amplifier circuit and inputting a detection signal of a current detector that detects a current value flowing through the motor or a voltage detector that detects a voltage value applied to the motor directly or via a bias circuit to an input terminal (first input terminal Tinp, second input terminal Tinn) of the auto-zero amplifier.

Employing such a configuration enables the driver circuit to acquire the feedback amount with high accuracy and to perform feedback control with high accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An amplifier circuit comprising:

a main amplifier;

a null amplifier whose offset voltage is corrected by a predetermined offset correction voltage, the null amplifier operating as an ideal amplifier and correcting an offset voltage of the main amplifier;

a first switch;

a second switch;

a third switch;

a fourth switch;

a first capacitor;

a second capacitor;

a third capacitor;

a first input terminal;

a second input terminal; and a first output terminal, wherein the main amplifier includes a non-inverting input terminal connected to the first input terminal, an inverting input terminal connected to the second input terminal, and an output terminal connected to the first output terminal, the null amplifier includes a non-inverting input terminal connectable to the second input terminal via the first switch and connectable to the first input terminal via the second switch, an inverting input terminal connected to the second input terminal, and an output terminal connected to one end of the third switch and one end of the fourth switch, the first switch includes one end connected to the second input terminal and another end connected to the non-inverting input terminal of the null amplifier, the second switch includes one end connected to the first input terminal and another end connected to the non-inverting input terminal of the null amplifier, the third switch includes one end connected to the output terminal of the null amplifier and another end connected to one end of the first capacitor and an offset correction voltage input terminal of the null amplifier, the fourth switch includes one end connected to the output terminal of the null amplifier and another end connected to one end of the second capacitor and an offset correction voltage input terminal of the main amplifier, the first capacitor includes one end connected to the offset correction voltage input terminal of the null amplifier and another end being grounded, the second capacitor includes one end connected to the offset correction voltage input terminal of the main amplifier and another end being grounded, the third capacitor includes one end connected to the output terminal of the null amplifier and another end being grounded, the first switch and third switch are in an ON state in a first operation mode in which the offset voltage of the null amplifier is corrected, the second switch and the fourth switch are in the ON state in a second operation mode in which amplification is performed while correcting the offset voltage of the main amplifier, and "$fm<gm/\{2p\ (C\mathbf{3}+C\mathbf{1})\}$" is satisfied, where gm is a transconductance of the null amplifier, fm is a switching frequency between the first operation mode and the second operation mode, C1 is a capacitance of the first capacitor, and C3 is a capacitance of a third capacitor.

2. The amplifier circuit according to claim 1, wherein a capacitance value of the third capacitor is set in such a manner that the null amplifier has a gain greater than 1 at a switching frequency between the first operation mode and the second operation mode.

3. The amplifier circuit according to claim 1, wherein a capacitance value of the third capacitor is set in such a manner that a frequency characteristic of the second operation mode has a predetermined phase margin.

4. A driver circuit comprising an amplifier circuit and a detector, wherein the amplifier circuit includes:

a main amplifier;

a null amplifier whose offset voltage is corrected by a predetermined offset correction voltage, the null amplifier operating as an ideal amplifier and correcting an offset voltage of the main amplifier;

a first switch;

a second switch;

a third switch;

a fourth switch;

a first capacitor;

a second capacitor;

a third capacitor;

a first input terminal;

a second input terminal; and a first output terminal, the main amplifier includes a non-inverting input terminal connected to the first input terminal, an inverting input terminal connected to the second input terminal, and an output terminal connected to the first output terminal, the null amplifier includes a non-inverting input terminal connectable to the second input terminal via the first switch and connectable to the first input terminal via the second switch, an inverting input terminal connected to the second input terminal, and an output terminal connected to one end of the third switch and one end of the fourth switch, the first switch includes one end connected to the second input terminal and another end connected to the non-inverting input terminal of the null amplifier, the second switch includes one end connected to the first input terminal and another end connected to the non-inverting input terminal of the null amplifier, the third switch includes one end connected to the output terminal of the null amplifier and another end connected to one end of the first capacitor and an offset correction voltage input terminal of the null amplifier, the fourth switch includes one end connected to the output terminal of the null amplifier and another end connected to one end of the second capacitor and an offset correction voltage input terminal of the main amplifier, the first capacitor includes one end connected to the offset correction voltage input terminal of the null amplifier and another end being grounded, the second capacitor includes one end connected to the offset correction voltage input terminal of the main amplifier and another end being grounded, the third capacitor includes one end connected to the output terminal of the null amplifier and another end being grounded, the first switch and third switch are in an ON state in a first operation mode in which the offset voltage of the null amplifier is corrected, the second switch and the fourth switch are in the ON state in a second operation mode in which amplification is performed while correcting the offset voltage of the main amplifier, "fm<gm/{2p (C3+C1)}" is satisfied, where gm is a transconductance of the null amplifier, fm is a switching frequency between the first operation mode and the second operation mode, C1 is a capacitance of the first capacitor, and C3 is a capacitance of a third capacitor, the detector is configured to detect a drive current flowing through a motor acting as an external load connected to the first output terminal of the amplifier circuit or a voltage applied to the motor, and the driver circuit inputs a detection result of the detector to the first input terminal and the second input terminal of the amplifier circuit to control driving of the motor.

5. The driver circuit according to claim 4, wherein in the amplifier circuit, a capacitance value of the third capacitor is set in such a manner that the null amplifier has a gain greater than 1 at a switching frequency between the first operation mode and the second operation mode.

6. The driver circuit according to claim 4, wherein a capacitance value of the third capacitor is set in such a manner that a frequency characteristic of the second operation mode has a predetermined phase margin.

* * * * *